United States Patent [19]

Kessler et al.

[11] Patent Number: 4,756,272
[45] Date of Patent: Jul. 12, 1988

[54] MULTIPLE GAS INJECTION APPARATUS FOR LPCVD EQUIPMENT

[75] Inventors: Peter H. Kessler; Wilson D. Calvert, Sr., both of Round Rock; Faivel S. Pintchovski, Austin, all of Tex.

[73] Assignee: Motorola, Inc., Schaumburg, Ill.

[21] Appl. No.: 869,638

[22] Filed: Jun. 2, 1986

[51] Int. Cl.$^4$ .............................................. C23C 16/00
[52] U.S. Cl. ..................................... 118/715; 118/725; 118/50
[58] Field of Search ........................... 118/715, 725, 50

[56] References Cited

U.S. PATENT DOCUMENTS 4,573,431 3/1986 Sarkozy ................................. 118/725
4,592,307 6/1986 Jolly ..................................... 118/725

OTHER PUBLICATIONS

Webster's Third International Unabridged Dictionary, G & C Merriam Co., Springfield, Mass., p. 1376.

Primary Examiner—Richard Bueker
Attorney, Agent, or Firm—John A. Fisher; Jeffrey Van Myers; David L. Mossman

[57] ABSTRACT

A quick-release multiple gas injection pipe connector fitting for removable attachment to a gas reaction chamber having a plurality of gas injection passages. The fitting permits a number of gas inlet lines to be removed from or attached to a reaction chamber fixture in one operation without a separate removal or attachment step for each gas line. The fitting also facilitates a process where the reaction gases are preferably mixed only at the reaction site and not before.

12 Claims, 2 Drawing Sheets

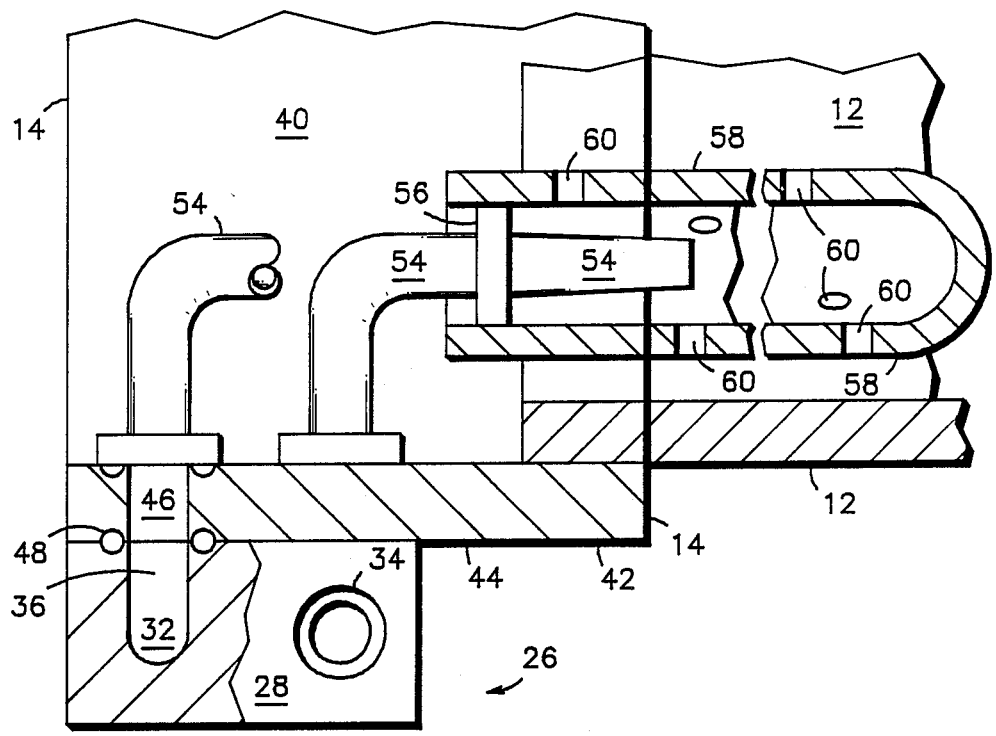
FIG. 2
FIG. 3
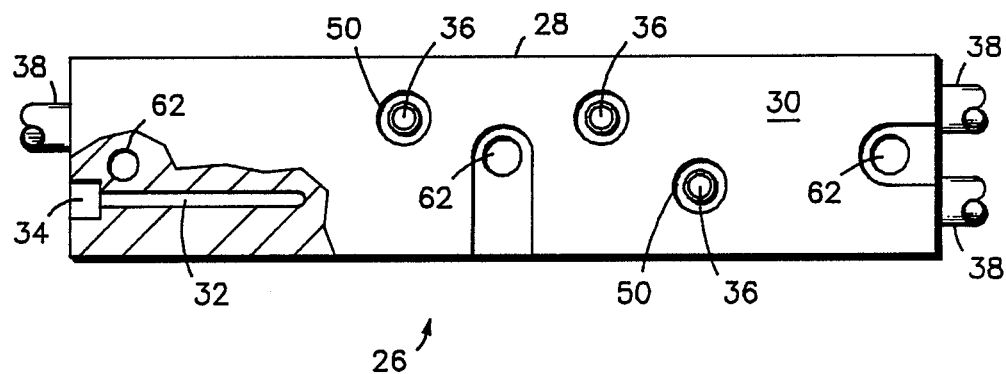

MULTIPLE GAS INJECTION APPARATUS FOR LPCVD EQUIPMENT

FIELD OF THE INVENTION

The invention relates to improvements in low pressure chemical vapor depositio (LPCVD) equipment used in integrated circuit processing, and more particularly relates to techniques and apparatus for injecting gases into LPCVD reaction chambers.

BACKGROUND OF THE INVENTION

In the wafer processing schemes used in the semiconductor industry, LPCVD reactors are generally hot wall, reduced pressure reactors that consist of a quartz tube heated by a furnace, typically comprising infrared heating elements, with pocess gas introduced into one end and pumped out to a vacuum pump at the other end. The LPCVD reactor tubes are sealed on the ends with cylindrical end caps through which all of the process gases flow. End caps are made to be removable so that the inside of the reactor tube may be serviced. Boats of wafers for processing are inserted through a door in one or the other of the end caps.

Pressures in the LPCVD reaction chamber are typically 0.25 to 2.0 torr (30 to 250 Pa) with temperatures ranging between 300° and 700° C. and even up to 1000° C. and gas flows between 100 and 1000 std. $cm^3$/min. (sccm). The reactions of the gases at high temperatures and low pressures cause thin layers of materials with desirable properties to be deposited on the surface of silicon wafers placed within the LPCVD reactor.

Commercial LPCVD reactors mix the reaction gases at a mixing or control panel that is physically some distance from the reactor tube. This permits the use of only one gas line into the LPCVD reactor itself, thereby simplifying the number of connections to the end cap. However, attempts at using low vapor pressure liquid sources or gases that may react at very low temperatures in such systems have proven unsatisfactory because the gases tend to react and form by-products or are used up before they reach the reaction zone in the vicinity of the wafers. No doubt premature reaction of pre-mixed gases is a problem in any process where reaction gases are to be mixed and reacted.

Multiple gas injection systems have been proposed, however, they have always involved separate attaching, sealing and changing steps for each of the gas lines, which may number three, four or more, and separate apparatus for each gas input line. See, for example, U.S. Pat. No. 4,573,431 issued Mar. 4, 1986. Since all of these proposed systems were tied to the end cap of the LPCVD reactor tube, a considerable amount of additional work had to be performed on the gas lines during removal and attachment of the end cap.

It would be desirable if a technique or an apparatus could be devices which would permit these incoming gases to react only at the deposition zone. Such a system would permit increased process development flexibility. Preferably, such a system would also have a simple and a quick detachment mechanism for all of the incoming gas lines.

SUMMARY OF THE INVENTION

Accordingly, it is an object of the present invention to provide an apparatus that would permit mixing of reaction gases only within the interior of the LPCVD reactors in close proximity to the semiconductor wafers.

Another object of the present invention is to provide a mechanism that permits the mixing of reaction gases only in the deposition zone which also permits quick disconnection and installation of all of the gas injection lines.

Still another object of the invention is to provide a multiple gas injection system that is not prone to leaks or material decomposition.

In carrying out these and other objects of the invention, there is provided, in one form, a quick-release multiple gas injection pipe connector fitting having a multiple pipe connector fitting body, an outlet mating face on one side of the multiple pipe connector fitting body, and a plurality of gas passages wherein each gas passage has an inlet port and an outlet port and the outlet ports of all of the passages terminate at the outlet mating face. The quick-release multiple gas injection pipe connector fitting also possesses means for removably mounting the fitting to a changer, such as an LPCVD reactor.

BRIEF DESCRIPTION OF THE DRAWINGS

FIG. 2 is a detailed side view of how the fitting of the present invention fits onto the end cap of an LPCVD reactor tube and fits into the gas injector system; and FIG. 3 is a top view of the multiple gas injection fitting of the present invention.

DETAILED DESCRIPTION OF THE INVENTION

Figure 1:
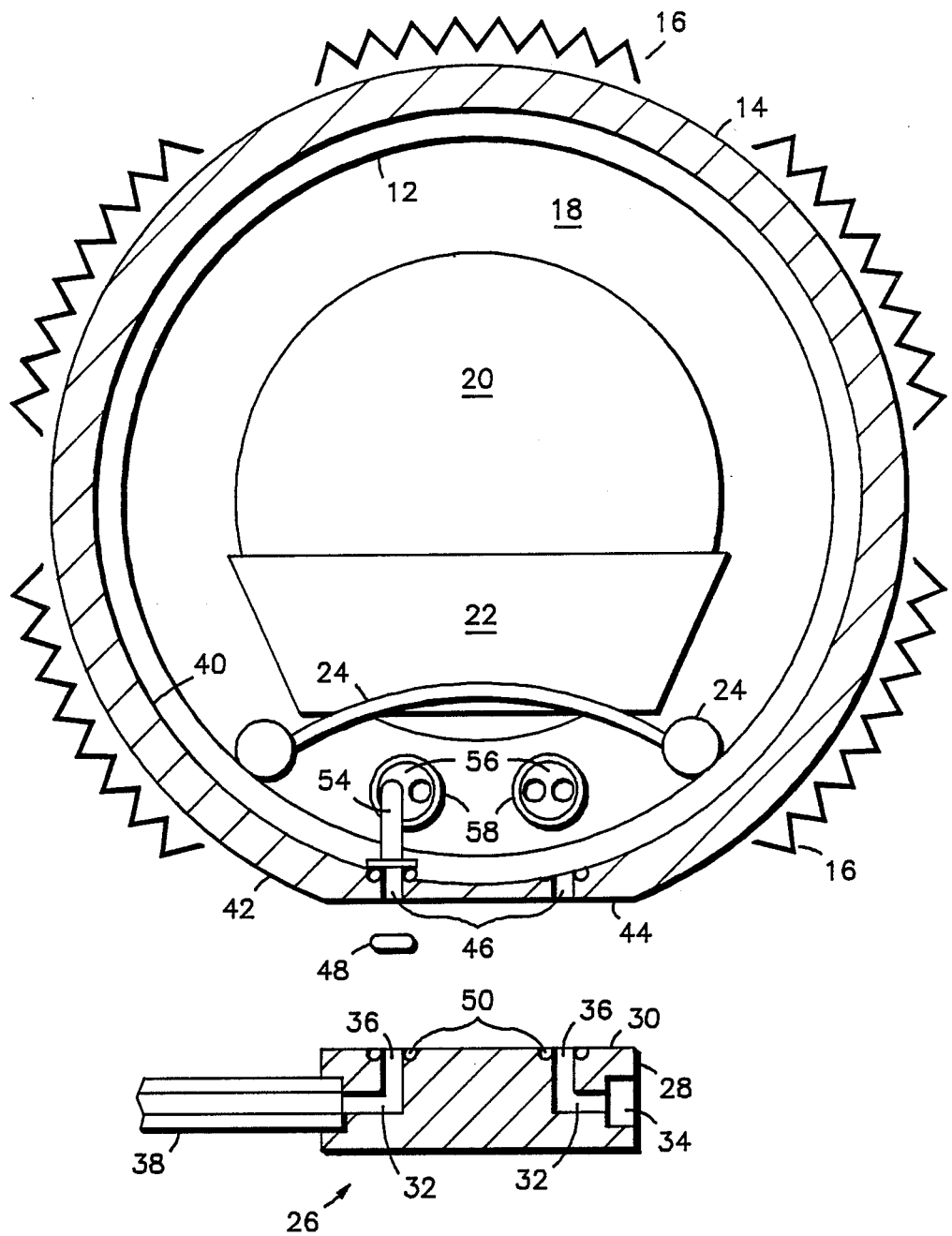
FIG. 1 is a schematic illustration of the interior of a LPCVD reactor looking into the reactor from the end showing the orientation of the present invention to the reactor.

Shown in FIG. 1 is a schematic illustration of a typical LPCVD reactor 10, which consists of a quartz tube 12, sealed by end cap 14 shown in cross-section. It will be appreciated that the end caps do not extend very far along the side of quartz tube 12 to permit the heat and light from furnace heating elements 16, such as infrared heaters, to enter the deposition zone 18 of the tube. The wafers 20, reside in a boat 22 which in turn rests ona support or "paddle" 24. The bottom of boat 22 and support 24 are open to the bottom of the tube 12 to permit the processes gases to flow upward over the wafers 20, although typically the wafers 20 do not actually protrude from the bottom of the boat as shown in FIG. 1.

The reaction gases are introduced into the reactor 10 by means of quick-release multiple gas injection pipe connector fitting 26 removably mountable on the bottom of end cap 14. Fitting 26 has a body 28 having an outlet mating face 30 on one side thereof. Piercing multiple pipe connector fitting body 28 are a plurality of gas passages 32 eachof which has an inlet port 34 and an outlet port 36. All outlet ports 36 should terminate at the outlet mating face 30, whereas the position of the inlet ports 34 and the shape and configuration of the gas passages 32 are left up to the designer. In the particular embodiment illustrated in the Figures, the gas passages have an L-shaped configuration and of the four gas passages 32, two have inlet on the left side of body 28 while the remaining two have inlets on the right side of body 28.

Gases are brought to the gas injection fitting 26 by means of gas lines 38 which connect to the inlet ports 34 by any common means, ideally by means of a removable, flexible connection. Gas lines 38 may be short pieces of tubing permanently attached to the manifold body 28 which may be removably conected to flexible lines at a later point away from body 26, or may be remoable at the inlet ports 34 of the body 28.

The gas injection fitting 26 is mountable to the LPCVD reactor chamber 10 on the end cap 14 in the particular embodiment seenin FIG. 1, although for the purposes of the invention end cap 14 is simply functioning as a chamber fixture onto which the fitting 26 may be attached. End cap 14 possesses both an inside surface 40 and an outside surface 42, which bears an inlet mating face 44 having a pluralityof gas inlet holes 46 which pierce the end cap 14 wall. The inlet mating surface 44 is adapted to fit flush with the outlet mating face 30 of the fitting 26 when the manifold 26 is attached to the end cap 14. In addition, the gas inlet holes 46 of the inlet mating face 44 must exactly correspond to the outlet ports 36 of the outlet mating face 30 to provide efficient transfer of gas and may be sealed with O-rings 48 which fit in O-ring grooves 50.

After the reaction gases pass through gas lines 38, manifold gas passages 32 and gas inlet holes 46, they enter gas injectors 54 which sit atop the inside ends of gas inlet holes 46. The joint of the gas injectors 54 with the gas inlet holes 46 may also be sealed with O-rings or Teflon sleves. Injectors 54 pierce ceramic fitting 56 to inject the reaction gases into injector tubes 58, which may be quartz or some other suitable material. In the particular embodiment of the fitting 26 illustrated, gas outlet ports 36 and gas inlet holes 46 are staggered and configured in two pairs. This arrangement permits the use of only two injector tubes 58 for four reaction gases, two reaction gases being injected into each injector tube 58.

FIG. 2 gives a more detailed illustration of the quick-release multiple gas injection pipe connector fitting 26 and system as seen from the side. Fitting 26 is removably attached to the bottom of end cap 14 such that the outlet mating face 30 of fitting 26 and inlet mating face 44 of end cap 14 fit snugly together and outlet ports 36 correspond to gas inlet holes 46. Once again, the reaction gases each separately enter their own inlet port 34 into the multiple gas injection pipe connector fitting body 28, travel along the individual gas passage 32 to the outlet port 36 at which time the gases go through the gas inlet holes 46 in the end cap 14 wall. Next, the reaction gas is injected into injector tubes 58 by means of gas injector 54, two of which are shown, to be distributed along the bottom of quartz reactor tube 12 beneath the wafers 20 by means of a plurality of gas exit holes 60. In this fashion, the reaction gases do not mix and react until they enter the deposition zone 18 of the wafers 20 resulting in a much more efficient reaction. In addition, the quick-release multiple gas injection pipe connector fitting 26 makes it possible to remove or install all of the gas lines simultaneously in one operation instead of a separate removal and installation procedure for each line. The back edge of end cap 14 is visible through transparent quartz reactor tube 12 and injector tubes 58, which may be quartz.

Shown in FIG. 3 is a top view of one particular embodiment of the quick-release multiple gas injection pipe connector fitting 26 of this invention viewing outlet mating face 30 head-on in which three of the four outlet ports 36 are visible. Of course, the invention is not limited by the number of gas passages 32 and associated inlets and outlets in the particular fitting 26 of the Figures, which may number more or less than four. As before, the reaction gases enter the body 28 via gas lines 38 and inlet ports 34 and are brought to the outlet ports 36 via gas passages 32, which may be of any convenient configuration. Outlet ports 36 may be surrounded by grooves 50 for the O-ring or Teflon sleeve seals 48. Additionally, the quick-release multiple gas injection pipe connector fitting 26 of FIG. 3 is provided with a plurality of mounting holes 62 to enable it to be removably attached to the underside of end cap 14. The exact nature of the attachment means of fitting 26 to end cap 14 or other chamber fixture is unimportant as long as the fitting may be easily removed therefrom and all of the gas lines 38 and gas passages 32 are disconnected simultaneously in one operation.

By means of the multiple gas injection system described, it is now possible to change end caps 14 without breaking line connections or otherwise disturbing gas inlet systems. It is also possible to break a plurality of connections with one operation instead of a plurality of procedures. In addition, the advantages of mixing the reaction gases only at the deposition zone 18 of the wafers 20 are retained, thus permitting increased process development flexibility. This design is particularly suitable for processes using low vapor pressure liquid sources or gases that may react at very low temperatures, such as the selective preparation of $TiSi_2$ at high temperature and low pressure.

Another advantage of the present invention is that it provides a multiple gas injection system that permits the gas inlet lines to remain attached to the end cap when the end cap is removed, if flexible gas lines are employed and if there is enough space at the end of the reactor to manipulate the end cap with the fitting attached. However, this is not the more preferably method of disconnection. As access space to the end of the reactor is ordinarily very limited, it is preferable to simply disconnect the manifold in one operation rather than to disconnect each gas line separately, and it is in this kind of disconnection procedure that the invention is most useful.

We claim:

1. A quick-release multiple gas injection pipe connector fitting to be removably mounted on an inlet mating face of a chamber comprising:
   a multiple pipe connector fitting body;
   an outlet mating face on one side of the multiple pipe connector fitting body;
   a plurality of gas passages wherein each gas passage has an inlet port and an outlet port and the outlet ports of all of the passages terminate at the outlet mating face; and
   means for removably mounting the fitting to the inlet mating face of the chamber such that the outlet mating face of the fitting meets with and corresponds to the inlet mating face of the chamber.

2. The quick-release multiple gas injection pipe connector fitting of claim 1 wherein the outlet ports are surrounded by O-ring sealing grooves.

3. The quick-release multiple gas injection pipe connector fitting of claim 1 wherein the inlet ports of the gas passages are provided with quick-release connection means.

4. The quick-release multiple gas injection pipe connector fitting claim 1 wherein each inlet port is provided with a permanent gas line.

5. A multiple gas injection system for removable attachment to a gas reaction chamber comprising:
  a chamber fixture comprising:
    a chamber wall portion having an inside surface and an outside surface;
    an inlet mating face on the outside surface of the chamber wall portion; and
    a plurality of gas inlet holes in the inlet mating face piercing the chamber wall portion;
  a quick-release multiple gas injection pipe connector fitting comprising:
    a multiple pipe connector fitting body;
    an outlet mating face on one side of the multiple pipe connector fitting body for mating with the inlet mating face of the chamber fixture; and
    a plurality of gas passages wherein each gas passage has an inlet port and an outlet port wherein the outlet ports of all of the passages terminate at the outlet mating face and correspond to the plurality of gas inlet holes in the inlet mating face of the chamber fixture; and
  quick-release means for removably mounting the fitting to the chamber fixture such that the outlet mating face of the fitting meets with and corresponds to the inlet mating face of the chamber.

6. The multiple gas injection system of claim 5 wherein the outlet ports and the corresponding gas inlet holes are surrounded by O-ring sealing grooves.

7. The multiple gas injection system of claim 5 wherein the inlet ports of the gas passages of the multiple gas injection pipe connector fitting are provided with quick release connection means.

8. The multiple gas injection system of claim 5 wherein the inlet ports of the gas passages of the multiple gas injection pipe connector fitting are each provided with a permanent gas line connection.

9. A multiple gas injection system for a low pressure chemical vapor deposition (LPCVD) reactor comprising:
  an LPCVD end cap comprising:
    an end cap wall portion having an inside surface and an outside surface;
    an inlet mating face on the outside surface of the end cap wall portion; and
    a plurality of gas inlet holes in the inlet mating face piercing the end cap wall portion;
  a quick-release multiple gas injection pipe connector fitting comprising:
    a multiple pipe connector fitting body;
    an outlet mating face on one side of the multiple pipe connector fitting body for mating with the inlet mating face of the LPCVD end cap; and
    a plurality of gas passages wherein each gas passage has an inlet port and an outlet port wherein the outlet ports of all of the passages terminate at the outlet mating face and correspond to the plurality of gas inlet holes in the inlet mating face of the LPCVD end cap; and
  quick-release means for removably mounting the fitting to the LPCVD end cap such that the outlet mating face of the fitting meets with and corresponds to the inlet mating face of the chamber.

10. The multiple gas injection system of claim 9 wherein the outlet ports are surrounded by O-ring sealing grooves.

11. The multiple gas injection system of claim 9 wherein the inlet ports of the gas passages of the multiple gas injection pipe connector fitting are provided with quick-release connection means.

12. The multiple gas injection system of claim 9 wherein each inlet port of the gas passages is provided with a permanent gas line connection.

* * * * *